(12) United States Patent
Simula et al.

(10) Patent No.: US 10,285,261 B1
(45) Date of Patent: May 7, 2019

(54) ELECTRICAL NODE, METHOD FOR MANUFACTURING AN ELECTRICAL NODE, ELECTRICAL NODE STRIP OR SHEET, AND MULTILAYER STRUCTURE COMPRISING THE NODE

(71) Applicant: TactoTek Oy, Oulunsalo (FI)

(72) Inventors: Tomi Simula, Oulunsalo (FI); Vinski Bräysy, Oulunsalo (FI); Mikko Heikkinen, Oulunsalo (FI); Juha-Matti Hintikka, Oulunsalo (FI); Juhani Harvela, Oulunsalo (FI); Minna Pirkonen, Oulunsalo (FI); Pasi Raappana, Oulunsalo (FI); Tuomas Heikkilä, Oulunsalo (FI); Jarmo Sääski, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/202,145

(22) Filed: Nov. 28, 2018

Related U.S. Application Data

(63) Continuation of application No. 16/113,467, filed on Aug. 27, 2018, now Pat. No. 10,194,526.

(51) Int. Cl.
| | |
|---|---|
| H05K 1/02 | (2006.01) |
| H05K 3/40 | (2006.01) |
| H05K 3/00 | (2006.01) |
| H05K 3/46 | (2006.01) |
| H05K 3/32 | (2006.01) |
| H05K 1/11 | (2006.01) |
| H05K 1/14 | (2006.01) |
| H05K 1/18 | (2006.01) |

(52) U.S. Cl.
CPC ......... *H05K 1/0271* (2013.01); *H05K 1/0203* (2013.01); *H05K 1/11* (2013.01); *H05K 1/144* (2013.01); *H05K 1/185* (2013.01); *H05K 3/0014* (2013.01); *H05K 3/32* (2013.01); *H05K 3/40* (2013.01); *H05K 3/4644* (2013.01); *H05K 2201/042* (2013.01); *H05K 2201/066* (2013.01); *H05K 2201/068* (2013.01); *H05K 2201/09118* (2013.01); *H05K 2203/1305* (2013.01)

(58) Field of Classification Search
CPC ...... H05K 1/0271; H05K 3/40; H05K 3/0014; H05K 3/32; H05K 1/0203; H05K 1/11; H05K 1/185; H05K 2203/1305; H05K 2201/09118; H05K 2201/066; H05K 2201/068
USPC .......................................... 174/251
See application file for complete search history.

(56) References Cited

U.S. PATENT DOCUMENTS

| | | | |
|---|---|---|---|
| 4,216,577 A * | 8/1980 | Badet ............... | G06K 19/07718 156/219 |
| 4,222,516 A * | 9/1980 | Badet ............... | G06K 19/07718 228/5.1 |
| 6,081,426 A | 6/2000 | Takeda et al. | |
| 6,208,526 B1 | 3/2001 | Griffin et al. | |

(Continued)

*Primary Examiner* — Sherman Ng
(74) *Attorney, Agent, or Firm* — Robert P. Michal, Esq.; Carter, DeLuca & Farrell LLP

(57) ABSTRACT

An electrical node including a first substrate film defining a cavity and a first material layer arranged to at least partly fill the cavity, and to embed or at least partly cover at least one electrical element arranged into the cavity, wherein the first material layer includes elastic material to reduce thermal expansion related stresses between elements adjacent thereto.

27 Claims, 8 Drawing Sheets

(56) References Cited

U.S. PATENT DOCUMENTS

| | | | |
|---|---|---|---|
| 6,214,525 | B1 | 4/2001 | Boyko et al. |
| 8,816,492 | B1 | 8/2014 | Minervini |
| 2007/0090473 | A1* | 4/2007 | Engling ................ B81B 7/0058 257/414 |
| 2008/0173097 | A1* | 7/2008 | Bauer ................ G01L 19/0069 73/756 |
| 2008/0283279 | A1 | 11/2008 | Ogawa |

\* cited by examiner

ELECTRICAL NODE, METHOD FOR MANUFACTURING AN ELECTRICAL NODE, ELECTRICAL NODE STRIP OR SHEET, AND MULTILAYER STRUCTURE COMPRISING THE NODE

CROSS-REFERENCE TO RELATED APPLICATIONS

This application is a continuation of U.S. patent application Ser. No. 16/113,467 filed Aug. 27, 2018, the disclosure of this application is expressly incorporated herein by reference in its entirety.

FIELD OF THE INVENTION

The present invention relates in general to electronic assemblies. In particular, however not exclusively, the present invention concerns electrical nodes for implementing functionality or functionalities in electronic assemblies including a molded, such as injection molded, plastic material layer.

BACKGROUND

There exists a variety of different stacked assemblies and structures in the context of electronics and electronic products. The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies failing under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) actually involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment.

In typical solutions, electrical circuits have been produced on a printed circuit board (PCB) or a on substrate film, after which they have been overmolded by plastic material. Known structures and methods have, however, some drawbacks, still depending on the associated use scenario. In order to produce an electronic assembly having one or more functionalities, typically rather complex electrical circuits for achieving these functionalities have to be produced on a substrate by printing and/or utilizing SMDs, and then be overmolded by plastic material. However, in the known solutions, the implementation of complex functionalities may face reliability risks and assembly yield issues arising from challenges in integrating very dense components and components with complex geometries. Furthermore, the electronic assembly may require, for example, the use of external control electronics which reduces degree of integration and makes the structures less attractive. Directly integrating dense components and components of complex geometry can be challenging and potentially very risky, as reliability will often be affected by molding pressure, for instance, and the assembly yields in different production phases can be very low. Subassemblies mounted or arranged on a PCB and covered with a plastic layer can suffer from mismatch in thermal expansion coefficients, be difficult to be overmolded due to their complex structure, and exhibit stresses in the structure which can tear the subassemblies off their electrical contacts. Challenges in thermal management may also generally cause issues such as overheating. Thus, there is still a need to develop structures and methods related to IMSE.

SUMMARY

The objective of the present invention is to at least alleviate one or more of the above drawbacks associated with the known solutions in the context of electronic assemblies utilizing molded or cast structures, and multilayer structures and electronics embedded therein.

The objective is achieved with various embodiments of an electrical node, a method for manufacturing, an electrical node, related assembly such as a node strip or sheet, and a multilayer structure in accordance with the present invention. Particularly, the objectives are reached by an electrical node, a method for manufacturing of an electrical node, an electrical node strip or sheet, and a multilayer structure as defined by the respective independent claims.

According to a first aspect, an electrical node is provided. The electrical node, which may be realized as a component, comprises a first substrate film defining a cavity, and a first material layer arranged to at least partly fill the cavity, and to embed or at least partly cover at least one electrical element arranged into the cavity.

In various embodiments, the cavity may define or exhibit a shape of, for example having regard to its cross-section, section and/or overall shape, substantially rectangular, dome-shaped, rounded, hemispherical, truncated cone, and/or or other preferred shape(s).

A substrate film such as the first substrate film may refer herein to a substrate in which one (e.g. z, such as "thickness") of the three dimensions is significantly shorter with respect to the other two (e.g. x and y) dimensions. The film substrate may, at least originally, be essentially planar or planar-like substrate.

In various embodiments, the first material layer may advantageously be of or comprise elastic material, such as elastomer or polyurethane, which materials used may be thermoplastic materials.

In various embodiments, the at least one electrical element may be attached or printed, such as screen printed or inkjet printed, on the first substrate film and into the cavity.

In various embodiments, the electrical node may comprise at least one second substrate, such as a printed circuit board, ceramic electrical substrate, film substrate, printed film substrate or patterned conductive polymer substrate, said at least one second substrate preferably comprising (hosting or defining, for instance) e.g. one or more electrical elements of the at least one electrical element, wherein the second substrate may be further arranged so that at least electrical and/or other element hosted by it is positioned into the cavity and embedded in or at least partly covered by the first material layer.

In various embodiments, the electrical node may comprise at least one electrical contact element electrically connected to the at least one electrical element, wherein the at least one electrical contact element is configured for providing electrical connection, such as galvanic, capacitive or inductive connection, into the node and e.g. said at least one electrical element, typically from the environment and/or exterior of the node (host structure, external system, etc.).

In various embodiments, the electrical node may comprise a second material layer arranged on the at least one electrical element for reducing e.g. air pockets between the at least one electrical element and the first material layer.

In various embodiments, the electrical node may comprise at least one second electrical element, such as a capacitive sensing element or an antenna or a resonating element, arranged on the first substrate film on the opposite side of the first substrate film with respect to the cavity.

In various embodiments, the at least one electrical contact element may be arranged at least at a peripheral portion of the first substrate film for providing electrical connection into the node, such as via galvanic, capacitive or inductive coupling element or elements.

In various embodiments, the electrical node may comprise an air pocket within the first material layer. The air pocket or generally gas pocket may contain any one or more gases, such as air or inert gases, for instance.

In various embodiments, the first substrate film may be a formed, such as a thermoformed, substrate film, and/or an injection molded substrate film defining the cavity.

In various embodiments, the node, or an embodiment of a multilayer structure or assembly comprising at least one node (described in more detail hereinlater), comprises at least one thermal management element, for cooling or heating, for instance, such as at least one element selected from the group consisting of: a heat sink, a thermal slug, and a thermal well. The thermal management element may be arranged completely within the cavity, or partly within/outside the cavity, for example, on the first substrate film or extending outside the cavity from an essentially open side of the cavity. In some embodiments, the thermal management element may be arranged through the first substrate film via a cut or a through-hole, for instance. Furthermore, the thermal management element may be arranged the extend through the second substrate, if any.

In various embodiments, the thermal management element may comprise a heat sink, which may be arranged e.g. completely or at least partly inside the cavity.

In various embodiments, element(s) such as conductors, contacts or connectors, as a part of, connected or integral with the thermal management element, may comprise material having high thermal conductivity, such as of thick copper conductors.

In various embodiments, the thermal management element or elements, such as heat pipes, may be arranged in connection with one or more other features of the node, such as a connector or contact, to optionally operate e.g. as a heat sink or to conduct heat into or out of the node.

In some embodiments of e.g. the assembly or multilayer structure, at least one thermal management element may be located essentially outside the node, optionally integral or connected with an element such as electronic component, considering e.g. high-power LEDs prone to (over)heating in certain circumstances. A thermal management element may be a substantially monolithic element, multi-part element (the parts may be removably or fixedly connected), and/or integral with some other element(s), such as a connector or electrical element.

In various embodiments, the thermal management element may be configured to at least thermally, if not e.g. physically, to connect or contact the node, a feature such as an electrical element, fill, substrate, conductor, contact and/or connector thereof, other element outside the node, and/or e.g. (electronic) component of the multilayer structure or assembly including at least one node. The associated thermal connection may be convection, conduction and/or radiation based, for instance.

According to a second aspect, a method for manufacturing an electrical node is provided. The method comprises obtaining a first substrate film defining a cavity, and providing a first material layer by filling at least partly the cavity with a first material, wherein at least one electrical element arranged into the cavity is being embedded in or at least partly covered by the first material layer.

In an embodiment, the method may comprise providing at least one electrical contact element to the electrical node, wherein the at least one electrical contact element is electrically connected to the at least one electrical element, and wherein the at least one electrical contact element is configured for providing electrical connection, such as galvanic, capacitive or inductive connection, into the node.

In an embodiment, the at least one electrical contact element may be arranged at least at a peripheral portion of the first substrate film for providing electrical connection into the node.

In an embodiment, the method may comprise, prior to the provision of the first material layer, printing, such as screen printing or inkjet printing, at least portion of the at least one electrical element on the first substrate film and arranged into the cavity defined by the film. In addition to or instead of printing, at least partially ready-made electrical element may be mounted upon the film.

In an embodiment, the method may comprise obtaining at least one second substrate, such as a printed circuit board or a piece thereof, or a film type substrate, comprising the at least one electrical element, and arranging the second substrate so that the at least one electrical element is positioned into the cavity.

In an embodiment, the obtaining of the first substrate film may comprise processing preferably through forming, such as thermoforming, a substrate film to define the cavity, or obtaining the first substrate film by molding, such as injection molding, to comprise the cavity. At least a portion of an element such as an electrical element of the at least one electrical element may be provided to the first substrate film prior to (while the first substrate film may still be substantially planar, for example, or more slightly three-dimensional) or subsequent to forming.

According to a third aspect, an electrical node assembly, such as a strip or sheet, comprising a plurality of electrical nodes is provided. The strip or sheet comprises a first substrate film defining a plurality of cavities, and at least a corresponding number of first material layers with respect to a number of the plurality of cavities, wherein each of said first material layers at least partly fills a respective one of the cavities and embeds the at least one electronic component therein.

In an embodiment, the electrical node strip or sheet, or other assembly, may comprise at least two of the corresponding number of first material layers forming common first material layer.

According to a fourth aspect, a multilayer structure for hosting e.g. electronics is provided. The multilayer structure preferably comprises
- at least one electrical node comprising: a first substrate film defining a cavity, and a first material layer arranged to at least partly fill the cavity, and to embed or at least partly cover at least one electrical element arranged into the cavity; and/or
- at least one electrical node assembly such as a strip or sheet comprising: a first substrate film defining a plurality of cavities, and at least a corresponding number of first material layers with respect to a number of the plurality of cavities, wherein each of said first material layers at least partly fills a respective one of the cavities and embeds the at least one electronic component therein.

The multilayer structure further preferably comprises a host substrate configured to host e.g. electronics, wherein said at least one electrical node or said at least one electrical node strip or sheet may be arranged on the host substrate, and preferably e.g. a molded or cast material layer covering said at least one electrical node or said at least one electrical node strip or sheet is additionally provided on the host substrate.

In an embodiment, said at least one electrical node or said at least one electrical node strip or sheet may be arranged on the host substrate such that the at least one electrical element is, or the elements are, between the first substrate film and the host substrate.

In an embodiment, the multilayer structure may comprise at least one second electrical element arranged at on one of the first substrate film on the opposite side of the first substrate film with respect to the cavity.

The present invention provides advantages over known solutions such that the electrical node reduces the complexity of integrating functionalities, for example, electrical circuits forming switch-mode power supplies and dense-pitch microcontrollers, into multilayer structures. In many cases the amount of wiring is also reduced. The number of functionalities that can be easily embedded in an electrical node according to the present invention greatly enhance value gained from implementing the structure and its functionalities with IMSE instead of using any of the available traditional technologies. The electrical node has a structure that can be optimized for efficiency, low electromagnetic interference (EMI) or other parameters, for instance. For example, a switch-mode circuitry can be tailored to meet emission limits with greatly reduced risk for failing results in electromagnetic compatibility (EMC) tests. From a software developing perspective, the effort required to implement IMSE structures can also be greatly reduced, as pre-selected and pre-manufactured electrical nodes will have known structure and known functionalities. Providing drivers with the possibility to auto-generate driver code based on pre-configurable functionality models can enable implementing the functionalities.

Additionally, the electrical node approach enables using a much greater proportion of currently available electrical components: most of the new components released to the market are packaged in very dense, tiny packages with potentially very high power density that are very challenging to directly integrate in IMSE structures due to physical limitations: print resolution, adhesive spreading and splatter, reliable filling and exclusion of air. For a designer not intimately familiar with the challenges in directly embedding complex circuitry and many components in plastic, the electrical node approach is significantly safer way to integrate the functionalities.

By inclusion of thermal management elements in the nodes, assemblies or multilayer structures as discussed herein many potential thermal management related issues such as overheating of electronic components may be reduced or avoided.

Various other advantages will become clear to a skilled person based on the following detailed description.

The expression "a number of" may herein refer to any positive integer starting from one (1).

The expression "a plurality of" may refer to any positive integer starting from two (2), respectively.

The terms "first", "second", "third" and "fourth" are herein used to distinguish one element from other element(s), and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and e.g. dependent claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Various embodiments of electrical nodes are described below, to be optionally flexibly and/or selectively combined by a person skilled in the art upon need.

Figure 1:
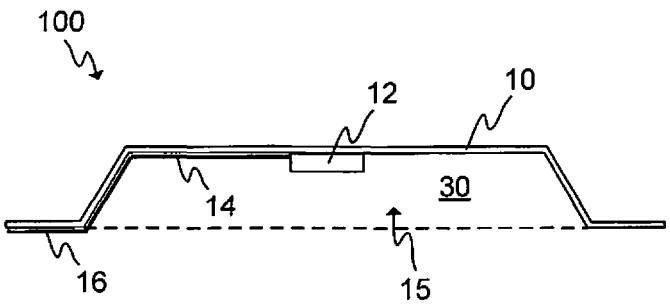
FIG. 1 illustrates schematically an electrical node according to an embodiment of the present invention.

FIG. 1 illustrates schematically an electrical node 100 according to an embodiment of the present invention. The electrical node 100 in FIG. 1 comprises a first substrate film 10, such as of polycarbonate (PC) or comprising PC, defining a cavity 15 (e.g. a recess or protrusion shape depending on the inspection angle) and a first material layer 30 or volume arranged to at least partly fill the cavity 15, and to embed or at least partly cover at least one electrical element 12 arranged into the cavity 15. In FIG. 1, the at least one electrical element 12, such as a capacitive sensing element or a conductor or a printed electronics component, such as a light emitting diode, has been printed, such as screen printed or inkjet printed, and/or otherwise provided on the first substrate film 10 and into the cavity 15. The element 12 may have been provided on the bottom of the cavity 15, for instance (e.g. substantially centered or provided closer to a side wall thereof). There may be only one element 12 or advantageously a plurality of electrical elements 12 forming e.g. an electrical circuit capable of providing at least one functionality, such as lighting. Furthermore, there may be at least one electrical contact or generally connection, or connecting, element 16 arranged to the electrical node 100 and configured for providing electrical connection, such as galvanic, capacitive or inductive connection, into the node 100, typically particularly from outside the node 100, e.g. from element(s) residing on a common host surface, structure or generally substrate with the node 100 and/or from element(s) external thereto. The electrical contact element 16 may be electrically connected via an intermediate electrical connection element 14, such as an electrical conductor 14, such as printed conductor, with the at least one electrical element 12 or the electrical circuit thereof, if not being directly connected therewith, for which purpose the element 12 may comprise a number of connecting features such as terminals or contacts.

According to various embodiments, the first material layer 30 may be or comprise polymer, plastic and/or silicone, for instance. According to various advantageous embodiments, the first material layer 30 may be elastic, thus providing e.g. mechanical protection for the electrical element or elements 12 embedded therein or at least partly covered by the first material layer 10.

In some embodiments, the first material layer 30 may be comprised of a plurality of materials or material layers.

Figure 2:
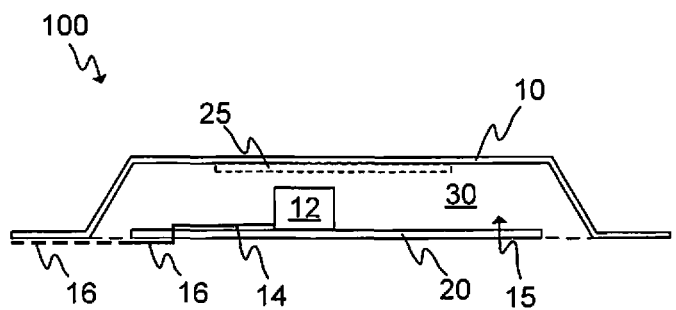
FIG. 2 illustrates schematically an electrical node according to an embodiment of the present invention.

FIG. 2 illustrates schematically an electrical node 100 according to an embodiment of the present invention. The electrical node 100 in FIG. 2 comprises a first substrate film 10 defining a cavity 15 and a first material layer 30 arranged to at least partly fill the cavity 15, and to embed or at least partly cover at least one electrical element 12 arranged into the cavity 15. In FIG. 2, the electrical node 100 further comprises a second substrate 20, such as a printed circuit board or a piece thereof, or a further film, comprising the at least one electrical element 12. Furthermore, the second substrate 20 is arranged so that the at least one electrical element 12 is positioned into the cavity 15 and embedded in or at least partly covered by the first material layer 30. There may be only one element 12 or advantageously a plurality of electrical elements 12 forming an electrical circuit capable of providing a functionality, such as lighting, on the second substrate 20. Furthermore, there may be an electrical contact element 16 arranged to the electrical node 100 and configured for providing electrical connection, such as galvanic, capacitive or inductive connection, into the node 100. As contemplated hereinbefore with respect to FIG. 1, the electrical contact element 16 may be electrically connected, optionally via an electrical connection element 14, with the at least one electrical element 12 or the electrical circuit thereof. There may be a number of features 25 such as electrical elements provided to the first film 10 as well, on any side of (depicted in the figure on the side facing the cavity 15).

Figure 3:
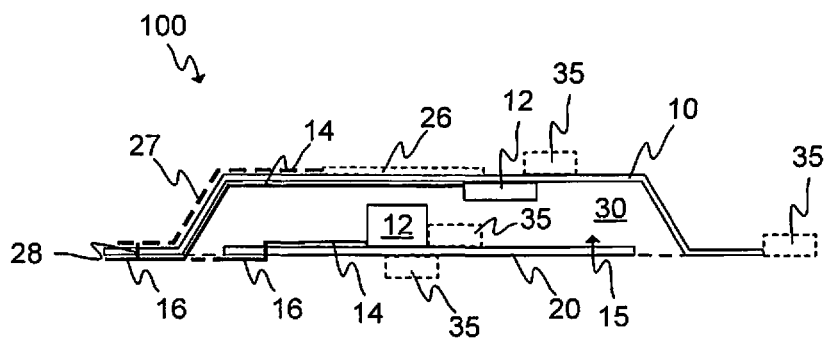
FIG. 3 illustrates schematically an electrical node according to an embodiment of the present invention.

FIG. 3 illustrates schematically an electrical node 100 according to an embodiment of the present invention. The electrical node 100 in FIG. 3 comprises a first substrate film 10 defining a cavity 15 and a first material layer 30 arranged to at least partly fill the cavity 15, and to embed or at least partly cover at least one electrical element 12 arranged into the cavity 15. However, in this case, there are at least two electrical elements 12 arranged into the cavity 15, at least one being arranged as in FIG. 1 and at least one other as in FIG. 2.

Furthermore, applicable also to FIGS. 1 and 2, there may be at least one second electrical element 26 arranged on the first substrate film 10 on the opposite side of the first substrate film 10 with respect to the cavity 15. In FIG. 3, the second electrical element 26, such as a capacitive sensing element 26, is arranged at a corresponding position with respect to the cavity 15, however, the second electrical element 26 could alternatively or in addition be arranged in other parts of the first substrate film 10 (see e.g. item 25 of FIG. 2). Still as a further option, the second electrical element 26 may be connected through a second electrical connection element 27 and/or via the feedthrough 28 to a feature such as an electrical contact element 16, being the same or a different one with respect to the electrical contact element 16 in connection with the electrical element 12.

According to various embodiments, such as any of ones shown in FIGS. 1-3, the node 100 may comprise a number of thermal management features or elements such as a heat sink for cooling the node, particularly the electrical element 12 or elements 12, thereof. The heat sink and/or other thermal management feature(s) may be embedded e.g. into the first material layer 30 and/or provided at least partly outside of the node 100 (utilizing e.g. a via/hole provided in the exterior part such as film 10 optionally prior to or subsequent to e.g. provision of cover plastics thereon using e.g. molding) in order to provide cooling, for instance. Still further, the heat sink or similar functionality may be arranged in connection with a heat exchanging element of an external device, or, for example, of a circuit board (consider e.g. metal core or thermal PCB). Generally, a thermal management element or feature may have a high thermal conductivity and e.g. heat dissipation properties, provided by the included material(s), dimensions, shape and/or (surface) area thereof. The material(s) may include many metals (e.g. copper, silver, aluminium) and their alloys in addition to or instead of e.g. thermally conductive polymers, pastes, molded material(s), for instance. In some embodiments, a thermal management element that is essentially a thermal insulator, may be utilized in addition to or instead of thermal conductors.

Thermal management element 35 may advantageously be configured to distribute, convey or spread thermal energy/heat within and/or outside the node 100. Thermal energy or heat may be conveyed to a selected or whole area of the node 100, and then outside the node 100, for example, through a second substrate 20, if any, or a host substrate 60, therefore, yielding e,g, more efficient cooling of the node 100 with respect to providing cooling at a single point. This may be particularly beneficial if the node 100 comprises compact high-power components, such as high-power LEDs or LED drivers, in order to avoid hotspots.

In various embodiments, the thermal conductivity of such thermal management element 35, or at least a part of it, may preferably be at least 2 W/mK, or preferably at least 10 W/mK, or more preferably at least 50 W/mK, or most preferably at least 100 W/mK. As being appreciated by a person skilled in the art, various materials having a lower thermal conductivity may be considered as thermal insulators whereas materials associated with a higher thermal conductivity may be generally more effectively utilized as thermal conductors e.g. for cooling/heat transfer purposes. The desired thermal conductivity may be obtained by suitable material selection of the thermal management element 35, for instance. In some embodiments, plastic material having thermal conductivity at least 10 W/mK may be utilized. In various embodiments, metal material, such as copper, aluminium, zinc, or tin-silver-copper (SnAgCu) composition, such as Sn—Ag3.5-Cu9.0, may be utilized in the thermal management element 35 or at least in part thereof. Thermal conductivities of various such metals are of the order of at least about 60 W/mK. Thus, quite many metals offer a better thermal conductivity than typical plastic materials, which may be exploited in various embodiments of the present invention for thermal management.

In various embodiments, the thermal management element 35, such as a thermal well, a thermal slug or a thermal pad, may be implemented at least partly by e.g. a lead frame, such as comprising of copper or copper alloy, of an electrical or electronics component. Furthermore, e.g. a thermal well may be implemented by a matrix of inlets through a substrate, such as a PCB. Thermal wells may particularly advantageously be utilized in multilayer substrates. Examples of thermal slugs or pads may comprise thermally conductive material arranged on a thin-shrink small-outline package (TSSOP) or on a quad-flat no-lead (QFN) package.

According to an embodiment, the electrical node 100 may indeed comprise a circuit board, such as the second substrate 20, or an electrical element 12 having a metal core or based on multilayer ceramics technology, such as high temperature co-fired ceramics (HTCC) or low temperature co-fired ceramics (LTCC), which may further provide cooling and/or heating through thermal conduction.

According to an embodiment, the thermal management element(s) 35 may, in addition to or instead of comprising dedicated element(s), be integrated with a number of elements and/or components of the electrical node 100. For example, this may entail utilizing electrical conductors designed with such properties, such as dimensions, that they function as a thermal management element 35 or at least a portion thereof, such as a heat sink or thermally conductive element.

In various embodiments, the electrical node 100 may comprise a thermal management element 35, such as at least one of the following: a heat sink, a thermal slug, a thermal well. The thermal management element 35 may be arranged within the cavity 15 or at least partly outside the cavity 15, for example, on the first substrate film 10 or extending outside the cavity from an open side of the cavity 15. The thermal management element 35 may, additionally or alternatively, be arranged through the first substrate film 10 via a cut or a through-hole, for instance. Furthermore, the thermal management element 35 may be arranged the extend through the second substrate 20, if any. Additionally or alternatively, the thermal management element 35 may comprise a heat sink arranged completely or at least partly inside the cavity 15. In some embodiments, the electrical contact element 16, as a part of the thermal management element 35, may comprise or consist of material having high thermal conductivity, such as of thick copper conductors. The thermal management element 35 or elements 35, such as heat pipes, may alternatively or additionally be arranged in connection with the electrical contact element 16 for operating as a heat sink or to conduct heat into or out of the electrical node 100.

In various embodiments, the electrical node 100 may comprise, such as being provided into the cavity 15, thermally conductive first material layer 30 to operate in addition to e.g. protective layer, for instance, as thermal management element 35. Still further, the first material layer 30 may be provided only partly, such as at corresponding positions with heat generating components, such as processing units or resistors, by utilizing thermally conductive material while the rest of the first material layer 30 may be of other material.

According to various embodiments in which the electrical node 100 has been arranged on a host substrate 60 or structure, the thermal management element(s) 35 may be in thermal connection with thermal management element(s) 35 of the host substrate 60. For example, there may be graphite or copper, such as pieces of graphite or copper tape, arranged on the host substrate 60 with corresponding positions with the electrical node 100. Still further, these thermally conductive elements may extend along the host substrate 60 to conduct heat away, for example, from the node 100.

In various embodiments comprising the electrical node 100 arranged on a host substrate 60 or structure, and comprising a molded or cast material layer 90 on the node 100, at least part of the molded or cast material layer 90 may be of thermally conductive material, if not completely, such as the part at least partly covering or embedding the first substrate film 10.

FIGS. 4A-4D illustrate schematically an electrical node 100 according to an embodiment of the present invention. FIGS. 4A-4D illustrate the electrical node 100 as a crosssectional side view, from above, from below, and from a perspective view, respectively. The electrical element 12, such as a printed or mounted component, is arranged preferably therewithin, e.g. on the bottom of the cavity 15, and, optionally, conductors 14 connecting the electrical element 12 to the electrical contact element 16 are arranged at the peripheral part of the first substrate film 10.

Figure 4A:
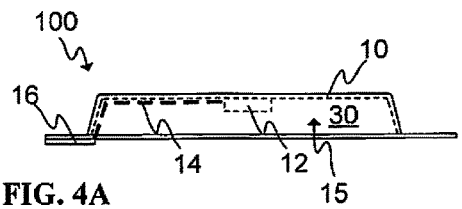
FIGS. 4A-4D illustrate schematically an electrical node according to an embodiment of the present invention.
Figure 4B:
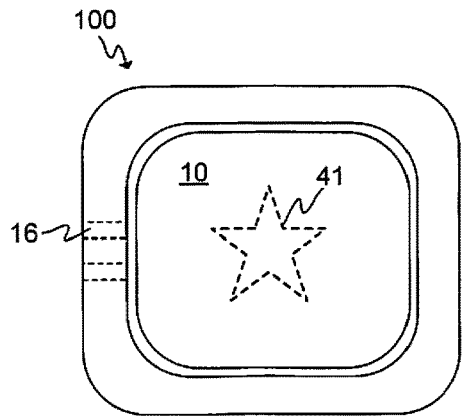
Figure 4C:
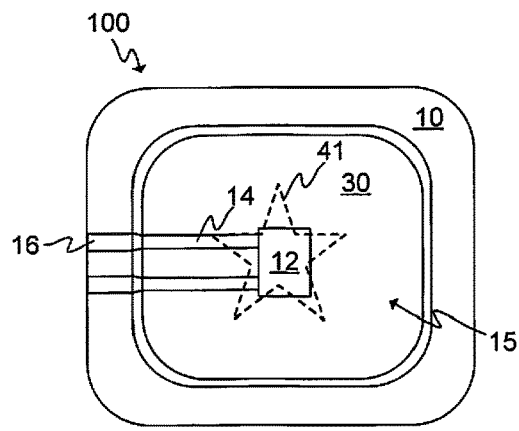
Figure 4D:
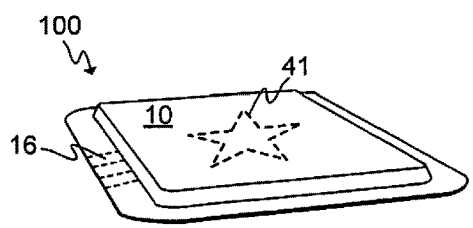

FIGS. 4B-4D further illustrate a functional and/or decorative element 41 being arranged on the first substrate film 10. The functional element 41 in FIGS. 4B-4D is or comprises, for example, a window of transparent material passing through light emitted by a light source arranged in the cavity 15, such as by a light-emitting diode (LED) type element 12. It may be utilized as a visual or optical indicator, and/or for lighting purposes, for example.

Figure 5A:
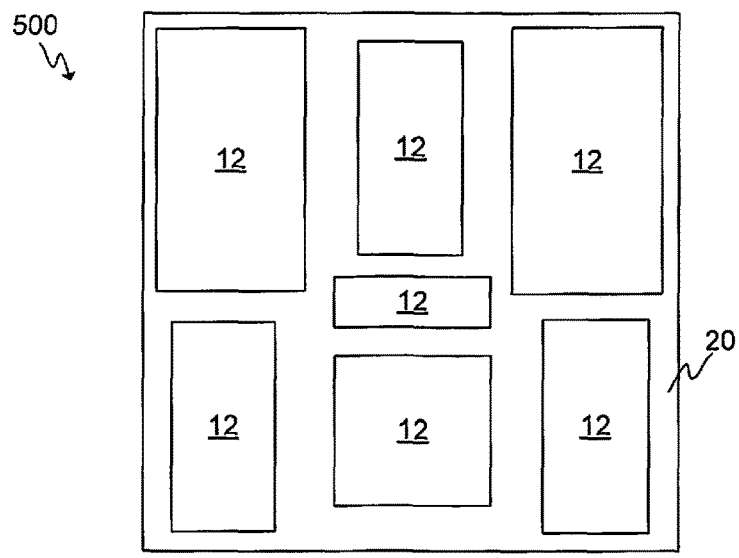
FIGS. 5A and 5B illustrate schematically a subassembly utilizable in an electrical node according to an embodiment of the present invention.
Figure 5B:
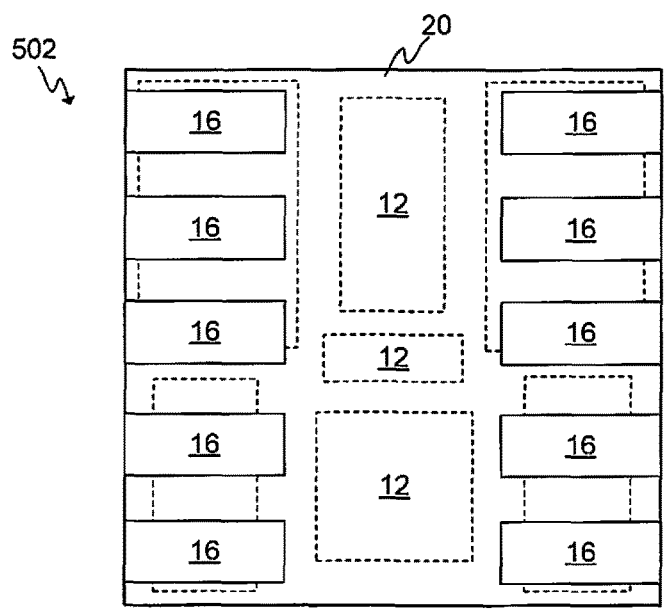

FIGS. 5A and 5B illustrate, at 500 and 502, schematically a subassembly utilizable in an electrical node 100 according to an embodiment of the present invention. The sub-assembly may comprise a plurality of electrical elements 12, preferably interconnected elements 12, forming an electrical circuit of the subassembly. The electrical circuit of this example case comprises elements of a two-channel LED driver can be as one sub-assembly on a substrate 20, such as a PCB. The subassembly may comprise, for example at the peripheral part thereof, inputs and/or outputs, in form of electrical contact elements 16, such as for electrical power, ground, two PWM (pulse-width modulation) inputs, two LED string anodes and two LED string cathodes on large, easy to mount contact pads instead of the complex jumble of circuitry between supply capacitors, inductors, timing resistors, sense resistors and tiny, power-dense driver IC. The subassembly may then be arranged into the cavity 15 and at least partly embedded or at least partly covered by the first material layer 30 according to an embodiment of the present invention. However, it could also be produced directly on the first substrate film 10 and into the cavity 15 or a region later establishing the cavity 15, and then arranged at least partly embedded or at least partly covered by the first material layer 30. It should further be noted, however, that various different kinds of subassemblies or electrical circuits having and/or configured to perform one or several functionalities may be arranged into an electrical node 100 according to an embodiment of the present invention, and not limited to the electrical circuit described hereinabove.

Figure 6A:
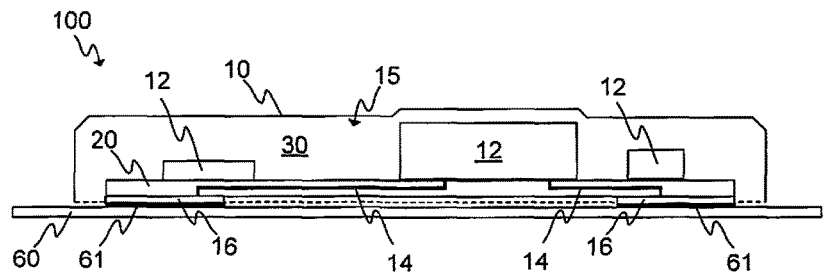
FIGS. 6A-6C illustrate schematically electrical nodes according to some embodiments of the present invention.
Figure 6B:
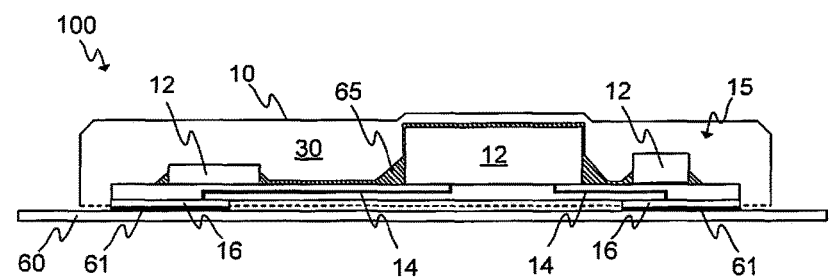
Figure 6C:
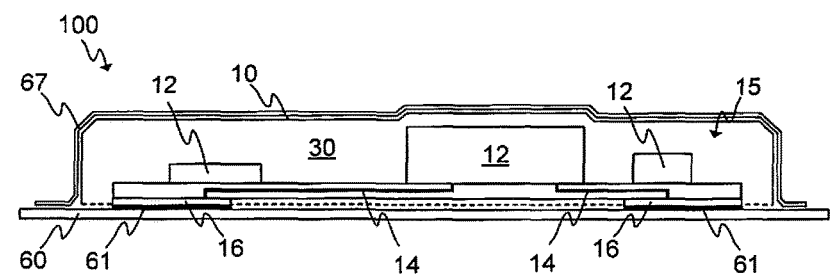

FIGS. 6A-6C illustrate schematically electrical nodes 100 according to some embodiments of the present invention. The electrical node 100 in FIG. 6A comprises a first substrate film 10 defining a cavity 15 and a first material layer 30 arranged to at least partly fill the cavity 15, and to embed or at least partly cover at least one electrical element 12 arranged into the cavity 15. In FIG. 2, the electrical node 100 comprises a second substrate 20, such as a printed circuit board or a piece thereof, comprising the at least one electrical element 12. Furthermore, the second substrate 20 is arranged so that the at least one electrical element 12 is positioned into the cavity 15 and embedded in or at least partly covered by the first material layer 30. There may be only one element 12 or advantageously a plurality of electrical elements 12 forming an electrical circuit capable of providing a functionality, such as lighting, on the second substrate 20. Furthermore, there may be an electrical contact element 16 arranged on the opposite side of the second substrate 20 with respect to the at least one electrical element 12 for providing electrical connection into the node 100.

FIG. 6A further illustrates a host substrate 60, such as a PCB or a film type substrate of e.g. plastic and/or organic material, onto which the electrical node 100 has been arranged on. The host substrate 60 preferably comprises electrical contact areas 61 to which the electrical node 100 may be, for example, attached by using conductive adhesive. The electrical node 100 is thus a component-like entity configured to perform one or several functionalities. The electrical connection between the node 100 and the host substrate 60, although shown as galvanic connection, may as well be arranged as capacitive or inductive connection. Furthermore, the first substrate film 10 of the electrical node 100 advantageously protects the components of in the cavity 15 when being overmolded by plastic and/or generally covered by further material, for instance.

The electrical node 100 in FIG. 6B is similar to one shown in FIG. 6A except that a second material layer 65 has been provided therewithin e.g. on the at least one electrical element 12 for reducing air pockets forming between the at least one electrical element 12 and the first material layer 30. The material(s) of the second layer 65 may differ from the one(s) of the primary fill (first layer) 30. The second material layer 65 may be covering the at least one electrical element 12, or at least some of them, if many, and, optionally, also at least part of the second substrate 20. The second material layer 65 may comprise or be, for example, of very easy-flowing and thoroughly wetting material, such as of liquid resin. The second material layer 65 may advantageously be used as a pre-filling material which flows into small gaps between electrical elements 12, such as electronic components, and/or parts of the structure and, thus, simplifies the geometry and/or "smooths" the surface(s) for facilitating the application of the first material layer 30.

The second material layer 65 may be of or comprise material, or a similar material, that is typically used in capillary underfill of IC components. The material layer 65 may, thus, be of a mixture of liquid organic resin binder and inorganic fillers. The organic binder may comprise, for example, epoxy resin mix or cyanate ester. Inorganic filler may include, for example, silica.

Alternatively or in addition, the second material layer 65 may be utilized in embodiments in which at least one electrical element 12 is arranged on the first substrate film 10 and into the cavity 15 for reducing air pockets.

The electrical node 100 in FIG. 6C is similar to one shown in FIG. 6A except that a layer such as a protective layer 67 has been arranged on the first substrate film 10. The protective layer 67 may also comprise on one or either one of its surfaces functional elements such as capacitive sensing elements or lighting devices or optical elements. The protective layer 67 may comprise e.g. a protective film, coating, shell structure and/or molded (plastic) layer as described in more detail with reference to FIG. 10, for instance. The protective layer 67 may cover one or a plurality of entities such as nodes 100 and/or other features such as electronic components provided on the host substrate 60.

Figure 7:
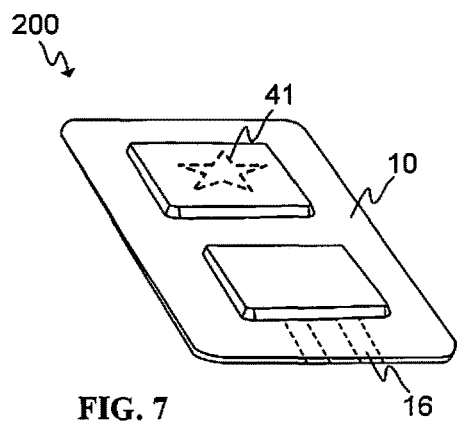
FIG. 7 illustrates schematically an electrical node strip according to an embodiment of the present invention.

FIG. 7 illustrates schematically an electrical node strip type embodiment of an assembly 200 according to the present invention. The strip assembly 200 comprises e.g. elongated first substrate film 10 defining a plurality of cavities 15, in this case two, and at least a corresponding number of first material layers 30 with respect to a number of the plurality of cavities 15. Each of said first material layers 30 at least partly fills a respective one of the cavities 15 and embeds the at least one electronic component 12 therein. There may be electrical contact elements 16 arranged on the first substrate film 10 which may further be connected to the electrical elements 12 in one or both of the cavities 15.

Furthermore, at least two of the corresponding number of first material layers 30 may form common first material layer 30. This may entail that the first material layer 30 essentially extends between two cavities 15 thus forming continuous material layer.

Figure 8A:
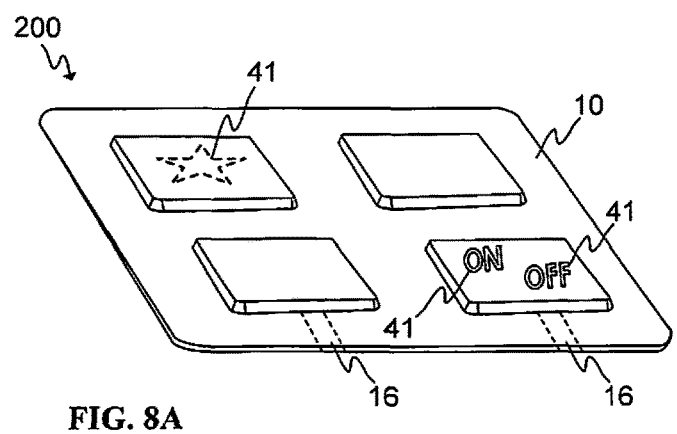
FIGS. 8A and 8B illustrate schematically an electrical node sheet according to an embodiment of the present invention.
Figure 8B:
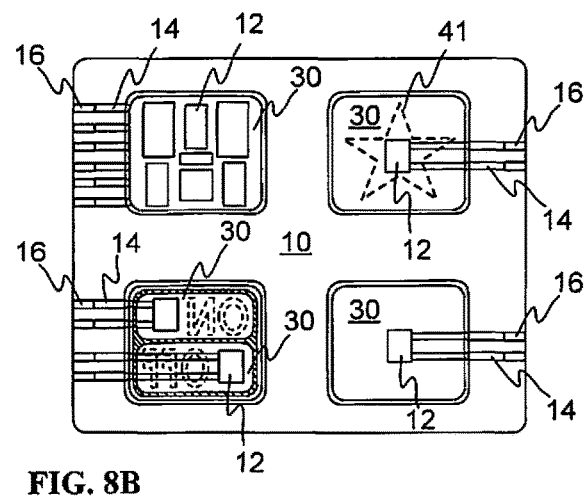

FIGS. 8A and 8B in turn illustrate schematically an electrical node sheet type assembly 200 according to an embodiment of the present invention. In FIG. 8A, the sheet assembly 200, hereinafter sheet, is shown as a perspective view from above the sheet 200. In FIG. 8B, the sheet 200 is shown as a perspective view from below the sheet 200. The sheet 200 comprises a first substrate film 10 defining a plurality of cavities 15, in this case four, and at least a corresponding number of first material layers 30 with respect to a number of the plurality of cavities 15. Each of said first material layers 30 at least partly fills a respective one of the cavities 15 and embeds the at least one electronic component 12 therein. There may be electrical contact elements 16 arranged on the first substrate film 10 which may further be connected to the electrical elements 12 in one, some or each of the cavities 15. Furthermore, at least two of the corresponding number of first material layers 30 may form common first material layer 30. This may entail that the first material layer 30 essentially extends between two cavities 15 thus forming continuous material layer.

FIGS. 7, 8A and 8B further illustrate a functional element 41 being arranged on the first substrate film 10. The functional element 41 may comprise, as discussed hereinearlier, for example, a window of transparent material passing through light emitted by a light source arranged in the cavity 15, such as by a LED.

In FIG. 8B, it is further illustrated that there may be more than one electrical element 12 arranged into one cavity 15. In this case, the lower left cavity 15, depicting "ON" and "OFF", may comprise e.g. two LEDs which are configured to illuminate one functional element 41, respectively, that is "ON" and "OFF". There may further be structures blocking the light of one LED from penetrating into the section of the other LED.

Figure 9:
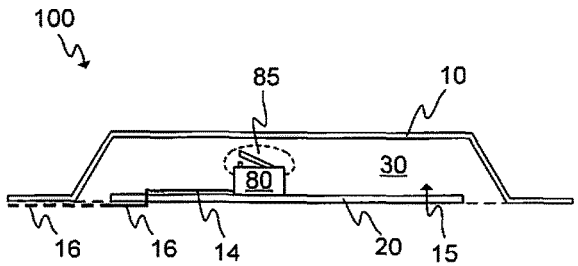
FIG. 9 illustrates schematically an electrical node according to an embodiment of the present invention.

FIG. 9 illustrates schematically an electrical node 100 according to an embodiment of the present invention. The electrical node 100 in FIG. 9 comprises a pocket such as air pocket 85 within the first material layer 30. The pocket 85 may contain any selected gas, such as air and/or one or several inert gases, or basically any type of gas or a combination thereof.

According to an embodiment, the pocket 85 may be utilized to enable the operation of e.g. a microelectromechanical system (MEMS) component 80, such as a switch, which requires that there is some free space or volume for a part of the component 80 to sufficiently move, for instance, to operate duly. The component 80 is a herein one type of an electrical element 12.

Figure 10:
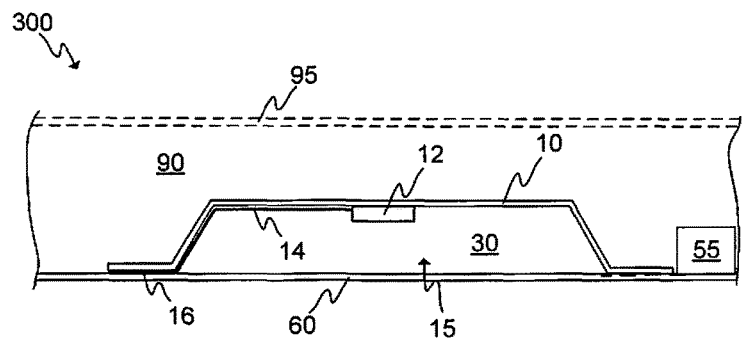
FIG. 10 illustrates schematically a multilayer structure according to an embodiment of the present invention.

FIG. 10 illustrates schematically a multilayer structure 300 according to an embodiment of the present invention. The multilayer structure 300 may comprise at least one electrical node 100 comprising: a first substrate film 10 defining a cavity 15, and a first material layer 30 arranged to at least partly fill the cavity 15, and to embed or at least partly cover at least one electrical element 12 arranged into the cavity 15; or at least one electrical node strip 200 or sheet 200 comprising: a first substrate film 10 defining a plurality of cavities 15, and at least a corresponding number of first material layers 30 with respect to a number of the plurality of cavities 15, wherein each of said first material layers 30 at least partly fills a respective one of the cavities 15 and embeds the at least one electronic component 12 therein.

The multilayer structure 300 may further comprise a host substrate 60, wherein said at least one electrical node 100 or said at least one electrical node strip 200 or sheet 200 is arranged on the host substrate 60. Furthermore, the structure 300 may comprise a molded or cast material layer 90 covering said at least one electrical node 100 or e.g. said at least one electrical node strip 200 or sheet 20 on the host substrate 60. In some embodiments, there may be at least one further element such as a second substrate film 95 arranged on the opposite side of the molded or cast material layer 90. The molded or cast material layer 90 may be at least partly transparent and thus light can travel trough the layer 90. Furthermore, the second substrate film 95, if any, may also include a number of decorative and/or functional elements 41, such as windows for passing through light emitted by a LED in the cavity 15, for instance. Yet, the structure 300 may host a number of elements such as electric or specifically electronic components 55 provided (mounted, printed, etc.) on the host substrate 60 and/or at least partially embedded in the layer 90, for instance. At least some of such elements 55 may be functionally such as electrically coupled to the node 100, and e.g. element 12 therein, via applicable connecting elements such as contacts and/or conductor traces, optionally defining at least a portion of a greater circuit design upon the host substrate 60, for example.

According to an embodiment, the at least one electrical node 100 or the at least one electrical node strip 200 or sheet type assembly 200 may be arranged on the host substrate 60 such that the at least one electrical element 12 is or elements 12 are between the first substrate film 10 and the host substrate 60.

According to an embodiment, the multilayer structure 300 may comprise at least one second electrical element arranged at on the first substrate film 10 on the opposite side of the first substrate film 10 with respect to the cavity 15.

Figure 11:
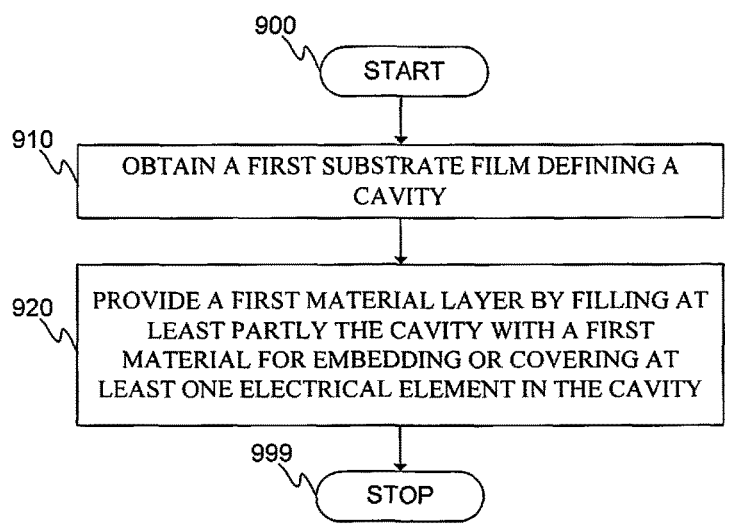
FIG. 11 illustrates a flow diagram of a method according to an embodiment of the present invention.

FIG. 11 illustrates a flow diagram of a method according to an embodiment of the present invention. At the beginning of the method for manufacturing an electrical node 100, a start-up phase 900 may be executed. During start-up, the necessary tasks such as material, for example substrates, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo)forming, electronics assembly, cut-ting, drilling and/or printing equipment, among others, may be thus ramped up to operational status at this stage.

At 910, a first substrate film 10 defining a cavity 15 may be obtained. According to an embodiment, the first substrate film 10 may be obtained by forming, such as thermoforming, cold-forming or utilizing vacuum or high pressure, an initial substrate film to define the cavity 15. According to another alternative or additional embodiment, the first substrate film 10 may be obtained by molding, such as injection molding, optionally directly in its target three-dimensional shape containing the cavity 15.

At 920, at least a first material layer may be provided by filling (e.g. by pouring, dispensing and/or (low-pressure) molding) at least partly the cavity with a first material. At least one electrical element 12 arranged into the cavity may at this step be embedded in or at least partly covered by the first material layer. At least one element of the electrical element 12 may be arranged to a target surface or material, e.g. on film 10, by mounting and/or printing, for example, optionally prior to or after said forming.

In some embodiments, the method may comprise providing at least one electrical contact or connection element 16 to the electrical node 100. The at least one electrical contact element 16 may be electrically connected to the at least one electrical element 12. The at least one electrical contact element 16 may be configured for providing electrical connection, such as galvanic, capacitive or inductive connection, into the node 100, especially from outside the node 100. This may entail, for example, having electrical contact pads 16 which may be optionally attached, such as soldered or by using conductive adhesive, to electrical contact elements of a host substrate 60, such as a PCB, for instance. According to various embodiments, the at least one electrical contact element 16, one or several, may be arranged at a peripheral portion of the first substrate film 10 for providing electrical connection into the node 100.

In some embodiments, as alluded to above, the method may comprise printing, such as screen printing or inkjet printing, or other forms of printed electronics technology, the at least one electrical element 12 on the first substrate film 10 and into the cavity 15, that is, on a portion of the first substrate film 10 forming the inner surface of the cavity 15. Alternatively or additionally, a number of further features such as contact elements 16 may be obtained by printed electronics technology.

In some embodiments, the method may comprise obtaining a second substrate 20, such as a printed circuit board, comprising the at least one electrical element 12, and arranging the second substrate 20 so that the at least one electrical element 12 is positioned into the cavity 15 so that the at least one electrical element 12 is embedded or at least partly covered by the first material layer 30.

In various embodiments, a number of conductive areas defining e.g. conductor lines (traces) and/or contact pads and/or electrodes to construct a circuit design are provided on the film(s), either or both sides thereof, preferably by one or more additive techniques of printed electronics technology. For example, screen, inkjet, flexographic, gravure or offset lithographic printing may be utilized. Also further actions cultivating the film(s) involving e.g. printing or generally provision of graphics, visual indicators, optical elements, etc. thereon may take place here. Accordingly, also a number of electrically non-conductive or insulating features may be provided preferably by printed electronics technology in the concerned structure.

In various embodiments, a number of thermal management elements may be provided (mounted, printed, preferably utilizing printed electronics technology, etc.), e.g. in connection with other elements such as element 12 (optionally integral therewith) as discussed hereinelsewhere. In some embodiments, one or more thermal management elements, or parts thereof, may provided e.g. on a host substrate 60 of a multilayer structure, outside an electrical node. A feature such as a connector or conductor may in some embodiments, besides its other or potential "primary" function, have also a thermal management function, which may be taken into account in the design of the feature having regard to e.g. material selection (e.g. both electrically and thermally conductive material such as a suitable metal may be used) and shape/dimensions.

In various embodiments, one or more nodes may be then provided in or utilized to establish a system or specifically, integral multilayer structure as described hereinelsewhere, for instance, the system or particularly, multilayer structure comprising a number of further features, optionally external device(s), in addition to the nodes.

At 999, method execution is ended.

Figure 12A:
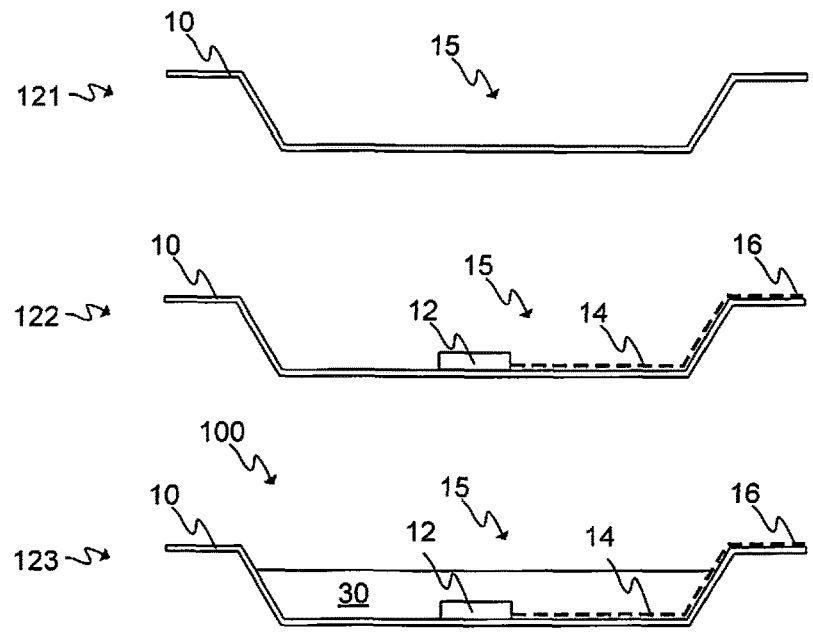
FIGS. 12A and 12B illustrate various stages of manufacturing an electrical node according to an embodiment of the present invention.
Figure 12B:
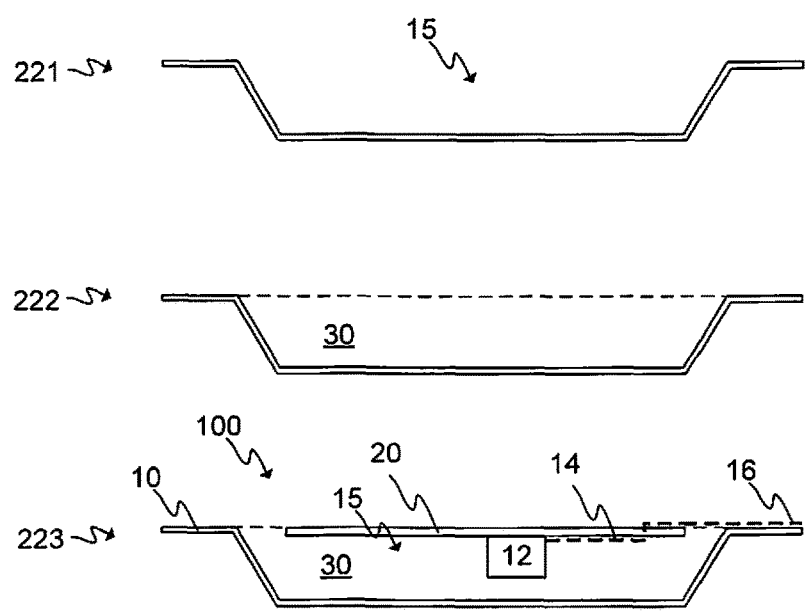

FIGS. 12A and 12B illustrate various potential stages of manufacturing an electrical node according to an embodiment of the present invention. Generally, various aspects described e.g. having regard to FIG. 11 are also applicable here.

In FIG. 12A, at 121, a first substrate film 10 defining a cavity 15 may be obtained. According to an embodiment, the first substrate film 10 may be obtained by forming, such as thermoforming, cold-forming or utilizing vacuum or high pressure, a substrate film (optionally initially planar) to define the cavity 15. According to another alternative or additional embodiment, the first substrate film 10 may be obtained by molding, such as injection molding. At 122, at least one electrical element 12 may be provided on the first substrate film 12 and into the cavity 15. Optionally, an electrical connection element 14 and electrical contact element 16 may also be provided on the first substrate film 10. At 123, a first material layer 30 may be provided to at least partly fill the cavity 15, and to embed or at least partly cover the at least one electrical element 12. In various embodiments, the first 30 and potential further material layers may optionally at least partially solidify, or be solidified, and/or otherwise change in terms of properties such as softness or elasticity, using a selected treatment, which may incorporate subjecting to heat, cold, temperature, and/or pressure, for example, and/or responsive to passage of time e.g. in suitable environment as to the above and/or other parameters.

In FIG. 12B, at 221, a first substrate film 10 defining a cavity 15 may be obtained. According to an embodiment, the first substrate film 10 may be obtained by forming, such as thermoforming, cold-forming or utilizing vacuum or high pressure, a substrate film to define the cavity 15. According to another alternative or additional embodiment, the first substrate film 10 may be obtained by molding, such as injection molding. At 122, a first material layer 30 may be provided to at least partly fill the cavity 15. At 123, at least one electrical element 12 may be provided, preferably on a second substrate 20, into the cavity 15 for embedding or at least partly covering the at least one electrical element 12. Optionally, an electrical connection element 14 and electrical contact element 16 may also be provided on the second substrate 20, or on the first substrate film 10, or e.g. after solidification of the first material layer 30, on the first material layer 30, or on two or more of said elements. According to another embodiment, the second substrate 20 comprising the electrical element 12 may first be arranged so that the electrical element 12 is in the cavity, or preferably at least part of the substrate 20 also, and only after that the first material layer 30 is being provided into the cavity 15 to embed or at least partly cover the electrical element 12.

A system comprising at least one electrical node as described herein (the included nodes may be mutually similar or different in terms of construction, materials, included elements and/or related functionalities) may be provided. In the system, the at least one node may be, optionally removably, attached to an external device, material and/or structure, e.g. to a selected target or host surface, or substrate, thereof, which may be provided with connecting feature(s) such as mechanical and/or electrical connecting elements for the node.

For the external device or structure, the at least one node may provide a desired functionality such as a sensing function, processing function, power transfer function, data storage function, indication, communication and/or user interface (UI) function. The at least one node and e.g. at least one electrical element such as electronic component therein may be functionally such as electrically, electromagnetically, thermally or optically connected to an element such as electronic component of the external device or structure e.g. via one or more connecting elements including e.g. a number of conductive traces, pins, connectors, wiring and/or cabling. Additional or alternative wireless (e.g. radio frequency) coupling is possible as well through implementing a selected wireless transfer technology and related elements (transmitter, receiver, transceiver). The at least one node and the element of the external device or structure may be configured to function cooperatively and thus establish a desired joint entity.

In some embodiments the system may be realized as a preferably integral multilayer structure, few feasible embodiments of which being deliberated also hereinbefore. The structure may contain one or more electrical nodes, optionally being functionally such as electrically connected together. Yet the structure may comprise a host substrate, optionally comprising formable such as thermoformable material that may be utilized or have been utilized to establish a desired three-dimensional shape through forming. The host substrate may be configured to accommodate the electrical nodes. Forming of the host substrate into a desired 3D-shape may take place prior to and/or subsequent to provision of features such as electrical nodes and/or other features thereon.

In various embodiments of the system or a multilayer structure as its one realization, e.g. molded or cast material layer comprising e.g. thermoplastic material may be provided on the host substrate, thus embedding at least portion of at least one of said one or more electrical nodes and/or other features such as further electrical elements (e.g. electronics including electronic component(s), for instance) provided thereon. The multilayer structure may indeed comprise a number of additional features such as electrical elements and/or thermal management elements provided to the host substrate and/or other layer of the structure and further optionally functionally, such as electrically and/or thermally, connected with at least one of said one or more electrical nodes to establish a desired connection for e.g. control, power, heat or data transfer purposes therebetween.

According to an embodiment, the electrical element 12 may comprise a processing unit, such as a microcontroller, signal processor or a processor. By arranging the processing unit into the node 100, access to the processing unit at least directly via its pins can be prevented. There can be arranged further components into the node 100 through which the access is possible and which may include proprietary software and selected protocols for controlled access.

In various embodiments of the node 100, various signals emitted, received and/or processed by it (e.g. by the electrical element 12) may comprise at least one element selected from the group consisting of: electrical signal, electromagnetic signal, optical signal, current, voltage, power signal, digital signal, analogue signal, analogue electrical signal, digital electrical signal, control signal and (other) data signal.

According to one embodiment, the electrical node 100 or related system/multilayer structure may be used in a security tag for clothing. Yet it may easily find use e.g. in connection with vehicles (e.g. in-vehicle electronics), lighting devices, wearable electronics, computing or communication devices, consumer electronics, measurement devices, and various other products.

In various embodiments, one or more, typically ready-made, components or elements including electronic components such as various SMDs may be attached or provided on the film(s) or (other) substrate(s) e.g. by solder and/or adhesives. Alternatively or additionally, printed electronics technology may be applied to actually manufacture at least part of the components, such as OLEDs, directly onto the film(s) or substrate(s).

As also discussed hereinelsewhere, the electrical element 12 may be provided on the film 10 utilizing any feasible positioning or installation technique such as standard pick and place method/equipment (when applicable). Applicable bonding (using e.g. adhesive or other bonding substance), gluing, and/or further securing techniques may be additionally utilized. Furthermore, the electrical element 12 may be printed, injection molded or dip molded.

In various embodiments, the electrical element 12 and/or other features of the node 100, multilayer structure 300 or aforementioned system may comprise at least one element selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical (MEMS) component, UI element, user input element, vibration element, sound producing element, communication element, transmitter, receiver, transceiver, antenna, resonator, infrared (IR) receiver or transmitter, wireless communication element, wireless tag, radio tag, tag reader, data processing element, data storage or memory element, electronic sub-assembly, light directing element, lightguide, lens and reflector. In case a sensor requiring functional connection with the environment is arranged e.g. within the node 100, the connection may be further provided thereto (e.g. fluidic, optical and/or electrical connection as also contemplated hereinbefore).

The node 100, or the multilayer structure 300, may thus incorporate electronics such as IC(s) and/or various components. At least part of the electronics of the multilayer structure 300 may be provided via an electrical node 100. Optionally, the node and/or one or more other elements such as electronic components or thermal management elements of the multilayer structure may be at least partially overmolded by a protective plastic layer as discussed hereinbefore. For example, adhesive, pressure, mechanical fixing features, and/or heat may be used for mechanical bonding of the node 100 with the film 10 or substrate 20, for instance. Solder, wiring and conductive ink are examples of applicable options for providing electrical connections between the elements of the node 100 and/or the structure 300, and with the remaining electrical elements, such as electronic components, in the structure 300.

Regarding the resulting overall thickness of the obtained electrical node 100, assembly such as the strip or sheet 200, and/or the multilayer structure 300, it depends e.g. on the used materials and related minimum material thicknesses providing the necessary strength in view of the manufacturing and subsequent use. These aspects have to be considered on case-by-case basis. For example, the overall thickness of the structure could be about 1 mm or a few millimeters, but considerably thicker or thinner embodiments are also feasible.

Further layers may be added, especially, to the structure 300 by lamination or suitable coating (e.g. deposition) procedure. The layers may be of protective, indicative and/or aesthetic value (graphics, colors, figures, text, numeric data, etc.) and contain e.g. textile, leather or rubber materials instead of or in addition to further plastics. Additional elements such as electronics may be installed at the outer surface(s) of the structure 300, such as the exterior surface of the substrate. A connector element for implementing e.g. electrical connection may be provided to the node 10 or structure 300 and connected to a desired external connecting element such as external connector and/or connector cable of an external device, system or structure. For example, these two connectors may together form a plug-and-socket type connection.

In various additional or supplementary embodiments, e.g. the film 10 may comprise or consist of material(s) such as plastics, e.g. thermoplastic polymer, and/or organic or biomaterials with reference to e.g. wood, leather or fabric, or a combination of any of these materials with each other or with plastics or polymers or metals. The film 10 may comprise or consist of thermoplastic material. The film 10 may be essentially flexible or bendable. In some embodiments, the film 10 may alternatively be substantially rigid. The thickness of the film may vary depending on the embodiment; it may only be of few tens or hundreds of a millimeter, or considerably thicker, in the magnitude of one or few millimeter(s), for example.

The film 10 may, for example, comprise at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

As alluded to hereinbefore, in various embodiments material(s) of the film 10 and/or of further layer(s) such as the second material layer 65 may at least partially be optically substantially opaque or at least translucent having regard to predefined wavelengths e.g. in visible spectrum. This is also applicable to the molded or cast material layer 90 as well as to the second substrate film 95, if any. The film 10 may have been provided with visually distinguishable, decorative/aesthetic and/or informative, features such as graphical pattern and/or color thereon or therein. The features may have been provided on the same side of the film with the electrical element 12 so that they have been also at least partially sealed, or on the opposite side and thus may or may not be sealed by the plastic material(s) through the associated overmolding procedure of the electrical node 100, for instance. Accordingly, IML (in-mold labeling)/IMD (in-mold decoration) technique is applicable. The used materials may be at least partially, i.e. at least in places, optically substantially transparent to radiation such as visible light emitted by the electronics thereon. The transmittance may be about 80%, 85%, 90%, 95% or higher, for example.

The molded material(s) may comprise thermoplastic and/or thermosetting material(s). Thickness of the molded or otherwise produced layer(s) may vary depending on the embodiment. It may be, for example, in the order of magnitude of less than one, one, few or tens of millimeters. E.g. the molded material may be e.g. electrically insulating.

In more detail, an included layer such as the second material layer 65 and/or e.g. layer 90 may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

In various additional or supplementary embodiments, a number of electrical elements 12, electrical connection elements 14 and/or electrical contact elements 16, such as pads, comprise at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

In various embodiments, selected features including also e.g. graphics, coloring or other visual features may be provided on internal surfaces or layers, e.g. on the side of a (substrate) film 10 that is facing the cavity 15 so that the features remain isolated and thus protected from potentially detrimental environmental effects at least by the thickness of the film 10 and potentially of surrounding protective layer 67, 90 of e.g. molded plastics 10. Accordingly, different impacts, rubbing, chemicals, etc. that could easily damage e.g. painted, printed or mounted surface features do not affect or reach the features. The film(s) may be easily manufactured or processed, optionally cut, into a desired shape with necessary characteristics such as holes or notches for exposing the underlying features such as material layers or e.g. electrical elements.

Figure 13:
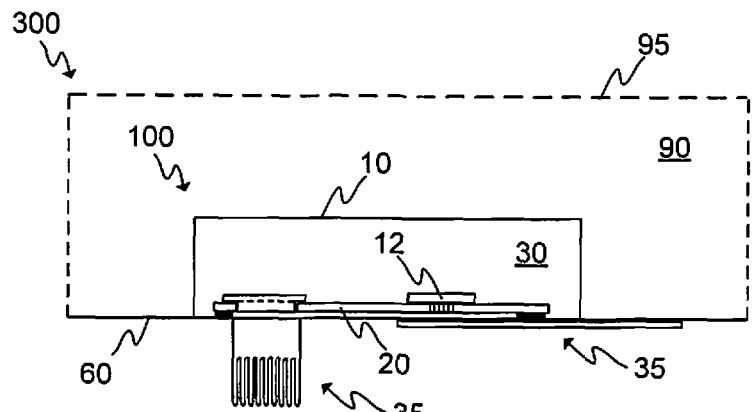
FIG. 13 illustrates schematically a further embodiment of the electrical node, provided with a number of applicable thermal management features.

FIG. 13 illustrates schematically a further embodiment of the electrical node 100, provided with a number of applicable thermal management features, or elements 35. In the embodiment of FIG. 13, as with various other embodiments incorporating thermal management elements, a thermal management element 35 may comprise a heat sink which may be optionally arranged at least partly, such as having a minor portion thereof, or about or over fifty, sixty, seventy, eighty, or ninety percent of the element (e.g. volume, area, and/or weight), outside the cavity 15 and/or the electrical node 100. However, in various embodiments in accordance with the one schematically shown in FIG. 13, the heat sink may be located at least partly inside the node 100 and/or specifically the cavity 15. There may, preferably, be a thermal conduction path, such as through an opening in the host substrate 60 and/or the second substrate 20, if any, between the thermal management element 35 and electrical elements, such as the at least one electrical element 12 or the converter element, which are arranged into the cavity 15 and generate heat. The thermal conduction path may additionally or alternatively comprise thermal conductive paste and/or thermally conductive parts or layers essentially arranged in contact with each other to form the path. In various embodiments, thermal and electrical conduction paths may be at least partially arranged by at least one common element in addition to or instead of dedicated elements, such as a connector or conductor comprising e.g. selected metal and/or other material, conducting both heat and electricity.

In various embodiments, the thermal management element 35 may be arranged on the opposite side of the cavity 15 with respect to the closed side or the top side of the cavity 15 when looking at FIG. 13. In other words, the thermal management element 15 may preferably be arranged on the open side of the cavity 15 such as in FIG. 13. Parts of the thermal conduction path may reside in the node 100 or the cavity 15, such as for conductive heat along the second substrate 20, if any. Furthermore, there may be thermally conductive material, e.g. graphite or copper, such as pieces of graphite or copper tape, arranged on the host substrate 60 and/or on an outer surface of the node 100. The tape may be arranged, for example, on the same side of the node 100 as the open side of the cavity 15 of the first substrate film 10. Optionally, a connecting element such as a connector of the node 100 connecting to an external device or system may host, be attached to, or define at least portion of a thermal management element 35.

Figure 14:
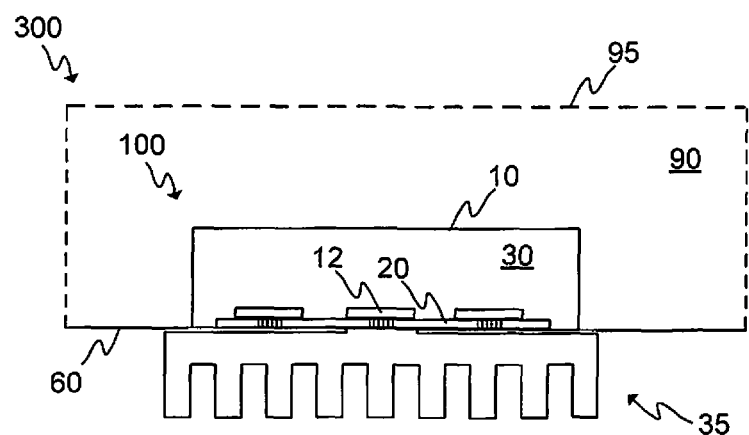
FIG. 14 illustrates schematically still a further embodiment of the electrical node, provided with a number of related thermal management features.

FIG. 14 illustrates schematically still a further embodiment of the electrical node 100, provided with a number of related thermal management features, such as elements 35.

In FIG. 14, the thermal management element 35 may be arranged by injection molding with thermally conductive material. Such a thermal management element 35 may be provide by a two-shot molding technique. There may, preferably, be an opening, such as a cut or the hole or through-hole in the host substrate and/or the second substrate 20, if any, so that the material of the thermal management element 35, such as of a heat sink or a heat pipe, becomes molded close to the heat generating element of the node 100.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For instance, instead of or in addition to molding the plastics directly onto a substrate (e.g. on item 60), a plastic layer could be prepared up-front and then attached to the substrate by suitable lamination technique applying e.g. adhesive, mechanical attachment means (screws, bolts, nails, etc.), pressure and/or heat. Finally, in some scenarios, instead of molding or casting, the plastic or other layer could be produced on the target substrate(s) using a suitable deposition or further alternative method. Yet, instead of printed, (electrically) conductive traces, the traces could be produced/provided otherwise. E.g. a conductor film manufactured utilizing etching or transfer lamination, among other options, could be applied.

The invention claimed is:

1. An electrical node, comprising:
   a first substrate film defining a cavity;
   a first material layer arranged to at least partly fill the cavity, and to embed or at least partly cover at least one electrical element arranged into the cavity; and
   a second substrate, having a first side and a second side, comprising the at least one electrical element on the first side, wherein the second substrate is arranged so that the entire first side and the at least one electrical element are positioned into the cavity and embedded in the first material layer;
   wherein the first material layer comprises elastic material, to reduce thermal expansion related stresses between elements adjacent thereto.

2. The electrical node according to claim 1, comprising the at least one electrical element being printed, such as screen printed or inkjet printed, on the first substrate film and into the cavity.

3. The electrical node according to claim 1, wherein the first material layer, at least locally comprises thermally conductive material defining at least a portion of at least one thermal management element relative to the at least one electrical element to conduct generated heat.

4. The electrical node according to claim 1, further comprising at least one electrical contact element electrically connected to the at least one electrical element, wherein the at least one electrical contact element is configured for providing electrical connection into the node.

5. The electrical node according to claim 1, further comprising a second material layer arranged on the at least one electrical element for reducing air pockets between the at least one electrical element and the first material layer.

6. The electrical node according to claim 1, further comprising at least one second electrical element arranged on the first substrate film on an opposite side of the first substrate film with respect to the cavity.

7. The electrical node according to claim 1, wherein the at least one electrical contact element is arranged at least at a peripheral portion of the first substrate film for providing electrical connection into the node.

8. The electrical node according to claim 1, comprising an air pocket within the first material layer.

9. The electrical node according to claim 1, wherein the first substrate film is a formed, substrate film or an injection molded substrate film defining the cavity.

10. The electrical node according to claim 1, further comprising a thermal management element.

11. The electrical node according to claim 1, wherein the elastic material comprises at least one of the thermoplastic, elastomeric and/or polyurethane material.

12. The electrical node according to claim 3, wherein the elastic material at least locally comprises or consists of thermally conductive material defining at least portion of at least one thermal management element relative to the at least one electrical element to conduct heat generated by it.

13. The electrical node according to claim 1, wherein the at least one electrical element is provided by mounting by printing.

14. The electrical node according to claim 1, wherein the at least one electrical element is produced by printing.

15. The electrical node according to claim 1, wherein the second substrate comprises at least one of a printed circuit board, ceramic electrical substrate, printed film substrate or patterned conductive polymer substrate.

16. The electrical node according to claim 4, wherein the electrical connection is at least one of a galvanic, capacitive or inductive connection.

17. The electrical node according to claim 9, wherein the substrate film is thermoformed.

18. The electrical node according to claim 10, wherein the thermal management element comprises a cooling or heating element selected from the group consisting of a heat sink, a thermal slug, and a thermal well.

19. A method for manufacturing an electrical node, the method comprising:
   obtaining a first substrate film defining a cavity,
   providing a first material layer by filling at least partly the cavity with a first material, wherein at least one electrical element arranged into the cavity is embedded in or at least partly covered by the first material layer; and obtaining a second substrate, having a first side and a second side, comprising the at least one electrical element on the first side, wherein the second substrate is arranged so that the entire first side and the at least one electrical element are positioned into the cavity and embedded in the first material layer;

wherein the first material layer comprises elastic material to reduce thermal expansion related stresses between elements adjacent thereto.

20. The method according to claim 19, further comprising:

providing at least one electrical contact element to the electrical node, wherein the at least one electrical contact element is electrically connected to the at least one electrical element, and wherein the at least one electrical contact element is configured for providing electrical connection into the node.

21. The method according to claim 19, wherein the at least one electrical contact element is arranged at a peripheral portion of the first substrate film for providing electrical connection into the node.

22. The method according to claim 19, further comprising, prior to providing of the first material layer, printing the at least one electrical element on the first substrate film and into the cavity.

23. The method according to claim 19, wherein the obtaining of the first substrate film comprises forming, such as thermoforming, a substrate film to define the cavity, or obtaining the first substrate film by molding, such as injection molding, to comprise the cavity.

24. The method according to claim 20, wherein the electrical connection is a galvanic, capacitive or inductive connection.

25. The method according to claim 22, wherein the printing comprises screen printing or inkjet printing.

26. An electrical node assembly, preferably being essentially a strip or sheet, comprising a plurality of electrical nodes, comprising:

a first substrate film defining a plurality of cavities, a second substrate, having a first side and a second side, comprising the at least one electrical element on the first side, wherein the second substrate is arranged so that the entire first side and the at least one electrical element are positioned into the cavity and embedded in the first material layer, and at least a corresponding number of first material layers with respect to a number of the plurality of cavities, wherein each of said first material layers at least partly fills a respective one of the cavities and embeds the at least one electronic component therein, the electrical node further comprising at least two of the corresponding number of first material layers forming a common first material layer; wherein the first material layers comprise elastic material to reduce thermal expansion related stresses between elements adjacent thereto.

27. A multilayer structure, comprising one of:

at least one electrical node comprising: a first substrate film defining a cavity, and a first material layer arranged to at least partly fill the cavity, and to embed or at least partly cover at least one electrical element arranged into the cavity, wherein the first material layer comprises elastic material to reduce thermal expansion related stresses between elements adjacent thereto; or at least one electrical node strip or sheet comprising: a first substrate film defining a plurality of cavities, and at least a corresponding number of first material layers with respect to a number of the plurality of cavities, wherein each of said first material layers at least partly fills a respective one of the cavities and embeds the at least one electronic component therein, wherein each of the first material layers comprises elastic material to reduce thermal expansion related stresses between elements adjacent thereto;

a host substrate, wherein said at least one electrical node or said at least one electrical node strip or sheet is arranged on the host substrate;

a molded or cast material layer covering said at least one electrical node or said at least one electrical node strip or sheet on the host substrate; and further comprising at least one feature selected from the group consisting of:

said at least one electrical node or said at least one electrical node strip or sheet being arranged on the host substrate such that the at least one electrical element is or elements are between the first substrate film and the host substrate; and at least one second electrical element being arranged at the first substrate film on the opposite side thereof with respect to the cavity.

* * * * *